(12) United States Patent
Jungerman (10) Patent No.: US 7,154,944 B2
(45) Date of Patent: Dec. 26, 2006

(54) MASK COMPLIANCE TESTING USING BIT ERROR RATIO MEASUREMENTS

(75) Inventor: Roger Lee Jungerman, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 889 days.

(21) Appl. No.: 10/284,805

(22) Filed: Oct. 31, 2002

(65) Prior Publication Data

US 2004/0086034 A1 May 6, 2004

(51) Int. Cl.
*H04B 17/00* (2006.01)
*H04L 27/06* (2006.01)

(52) U.S. Cl. ...................... 375/224; 375/340

(58) Field of Classification Search ............. 375/224, 375/340; 370/252; 714/704, 819; 702/66, 702/117
See application file for complete search history.

(56) References Cited

U.S. PATENT DOCUMENTS

| | | | | | |
|---|---|---|---|---|---|
| 3,721,959 | A | * | 3/1973 | George | 714/704 |
| 5,418,789 | A | * | 5/1995 | Gersbach et al. | 714/705 |
| 6,374,388 | B1 | * | 4/2002 | Hinch | 714/799 |
| 6,489,904 | B1 | * | 12/2002 | Hisano | 341/120 |
| 6,701,269 | B1 | * | 3/2004 | Jungerman et al. | 702/106 |
| 6,735,259 | B1 | * | 5/2004 | Roberts et al. | 375/316 |
| 6,785,622 | B1 | * | 8/2004 | Nygaard, Jr. | 702/67 |
| 6,810,346 | B1 | * | 10/2004 | Nygaard et al. | 702/117 |
| 6,816,987 | B1 | * | 11/2004 | Olson et al. | 714/704 |
| 2001/0021987 | A1 | * | 9/2001 | Govindarajan et al. | 714/705 |
| 2001/0033238 | A1 | * | 10/2001 | Velazquez | 341/118 |
| 2003/0174789 | A1 | * | 9/2003 | Waschura et al. | 375/340 |
| 2003/0177438 | A1 | * | 9/2003 | Waschura et al. | 714/819 |

FOREIGN PATENT DOCUMENTS

JP   2001-352350   4/2001

OTHER PUBLICATIONS

Analui, B. et al., A 10-Gb/s Two-Dimensional Eye-Open Monitor in 0.13-/SPL Mu/M Standard CMOS, Dec. 2005, IEEE Journal of Solid- State Circuits, vol. 40, pp. 2689-2699.*
DeFoster, S. et al., Manufacturing Test Of Fibre Channel Communications Cards And Optical Subassemblies, Oct. 20-25, 1996, Test Conference, 1996, Proceedings, International, pp. 127-134.*
BitAlyzer 1500 Bit Error Rate Analyzer, Specifications, available from Synthesys Research, Inc., 3475-D Edison Way, Menlo Park, CA 94025.

* cited by examiner

*Primary Examiner*—Emmanuel Bayard
*Assistant Examiner*—Lawrence Williams (57) ABSTRACT

Mask compliance of a digital signal from a reference device is determined. Bit error rates for first sampling points for a low mask region are detected. The bit error rates for the first sampling points are averaged to produce an average low mask region error rate. Bit error rates for second sampling points for a high mask region are detected. The bit error rates for the second sampling points are averaged to produce an average high mask region error rate.

17 Claims, 8 Drawing Sheets

MASK COMPLIANCE TESTING USING BIT ERROR RATIO MEASUREMENTS

BACKGROUND

The present invention pertains to the testing of digital communications systems and pertains particularly to mask compliance testing using bit error ratio measurements.

In digital communications systems, integrity of the waveform of signals used in communication is commonly specified as an eye mask. This is true, for example, in the specification of Synchronous Optical Network (SONET) standard and the specification of the Ethernet protocol.

Typically, a sampling oscilloscope also called a Digital Communications Analyzer (DCA), is used to make eye mask measurements and guarantee that no sampled points lie in the forbidden regions of the eye mask. Because the sampling rate of a DCA is relatively slow (for example in the range of approximately 40 kilosamples per second (kS/s)) compared to the input data rate (for example in the range of 10 gigabits per second (Gb/s)), it is not possible to sample a large fraction of the incoming bits.

For example an Agilent 86100B DCA, available from Agilent Technologies, Inc., can be used to measure and test for eye diagram compliance in high-speed digital communication signals. This DCA can produce an eye diagram that consists of a sampling oscilloscope display of overlapping 0's and 1's of the incoming data stream. The oscilloscope display is triggered on a high speed clock synchronous with the data stream. Within the eye diagram, an eye mask is a predefined area in which samples are not allowed. In a typical measurement and test for eye diagram compliance, approximately 500,000 samples are used. This typically requires about 13 seconds to perform.

Alternatively, an Agilent Technologies 81250 ParBERT system, also available from Agilent Technologies, Inc., allows sample Bit Error Ratio (BER) sampling points to be chosen and compared to predetermined BER thresholds.

Bit Error Ratio testing (BERT) typically measures and compares a large number of bits (typically $10^{10}$), so good statistical accuracy can be obtained. In a BERT, a known digital sequence is produced by a pattern generator (PG). The digital data stream is captured by the BERT error detector (ED), typically after passing through some device under test. After synchronizing, a local pattern generated in the ED is compared with the captured digital data stream. The ED counts errors in the incoming data and displays the Bit Error Ratio (BER).

In a fast eye measurement performed using the Agilent 81250 ParBERT system, sample BER points are chosen and compared to predetermined BER thresholds. For example, the fast eye measurement measures the BER of a predefined number of points (1 to 32). The whole eye is not measured. The predefined number of points are each defined by a threshold and timing value relative to the starting point of the measurement. To perform a measurement, the user enters pass/fail criteria of the measurement and the BER threshold, finds the middle point of the eye with the sequence and then runs the BER.

The fast eye measurement performed using the Agilent 81250 ParBERT system is related to the DCA based eye mask measurements that are specified in the standards, but is not exactly the same. For example, decision point positions represent samples of the BER eye contour. It is not necessarily clear to a customer how to interpret these BER thresholds compared to their traditional DCA mask measurement and to set them appropriately. Also, the DCA mask has regions outside the central eye region that are not addressed by the fast eye measurement performed using the Agilent 81250 ParBERT system. Additionally, the BERT front-end of the Agilent 81250 ParBERT system is not calibrated for frequency response (unlike a DCA) and this can distort the measured distribution and result in errors in the measurement.

The optical input of a DCA can be calibrated with a swept frequency sinusoidal modulated optical signal. This sinusoidal modulation can be produced with a continuous wave (CW) optical source together with an optical modulator. Calibrated versions of modulated CW optical sources such as the Agilent 8703 Lightwave Component Analyzer are commercially available. Very broadband optical modulation can also be produced by heterodyne of two wavelength-offset CW sources. For example the OMS-2010 calibrated swept sine wave source, available from Lightwave Electronics, operates to 110 GHz. These optical sources have calibrated modulation amplitude to frequencies much higher than are required to calibrate most digital decision circuit front-ends.

SUMMARY OF THE INVENTION

In accordance with a preferred embodiment of the present invention, mask compliance of a digital signal from a reference device is determined. Bit error rates for first sampling points for a low mask region are detected. The bit error rates for the first sampling points are averaged to produce an average low mask region error rate. Bit error rates for second sampling points for a high mask region are detected. The bit error rates for the second sampling points are averaged to produce an average high mask region error rate.

DESCRIPTION OF THE PREFERRED EMBODIMENT

Figure 1:
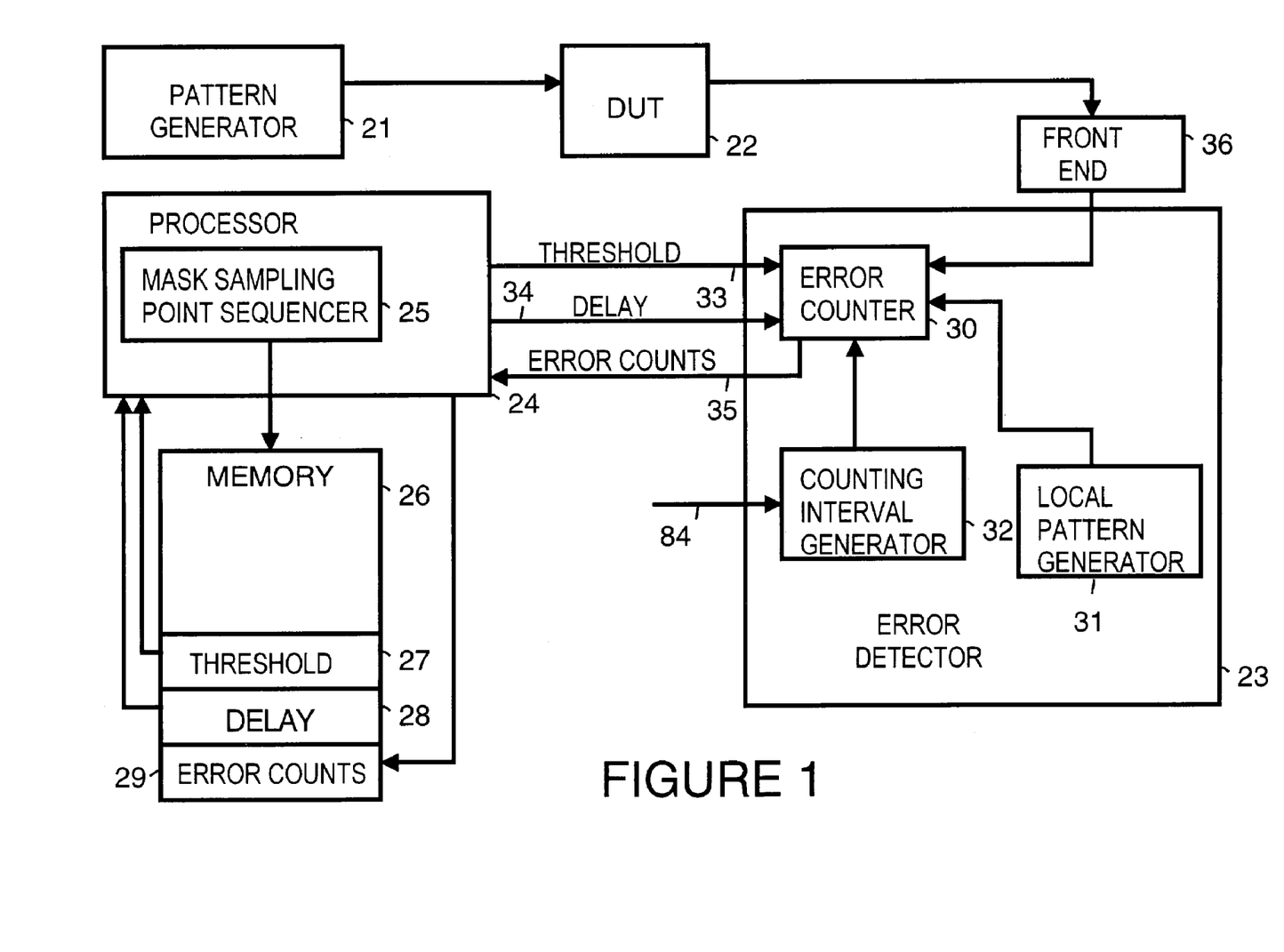
FIG. 1 is a simplified block diagram of an error detecting system used to measure mask violations in a digital signal in accordance with a preferred embodiment of the present invention.

FIG. 1 is a simplified block diagram of an error detecting system used to measure mask violations in a digital signal. A pattern generator 21 generates test patterns that are forwarded to a device under test (DUT) 22. A front end 36 receives output from DUT 22. If the output from DUT 22 is optical, front end 36 converts this to an electrical signal. An error counter 30 within an error detector 23 compares output from DUT 22 with expected output as generated by a local pattern generator 31. Error counter 30 produces error counts on an output 35. The error counts include a total error count, an error count for expected logic 0 values and an error count for expected logic 1 values. A counting interval generator 32 controls the interval at which counting is performed. Counting interval generator 32 uses a clock signal placed on a clock input line 84.

A processor 24 controls the testing process. A mask sampling point sequencer 25 controls the sequence in which sampling points on each mask is tested. Each sampling point is defined by a voltage threshold and a time delay from a synchronized point within a cycle of the digital signal. For each sampling point, a voltage threshold 27 and a time delay 28 are stored in a memory 26. For each sampling point, processor 24 accesses from memory 26 a threshold value 27 and forwards the threshold value to error counter 30 over a line 33. For each sampling point, processor 24 also accesses from memory 26 a delay value 28 and forwards the delay value to error counter 30 over a line 34. After performing testing for the sampling point, error counter 30 returns to processor 24, over output 35, error counts for the sampling points. The error counts include a total error count, an error count for expected logic 0 values and an error count for expected logic 1 values. The error counts are stored by processor 24 in location 29 within memory 26.

The error detection system shown in FIG. 1 allows mask compliance to be verified efficiently without constructing a detailed view of a full eye diagram. This significantly speeds up the measurement and minimizes system cost by performing the BER and mask tests on the same hardware.

Figure 2:
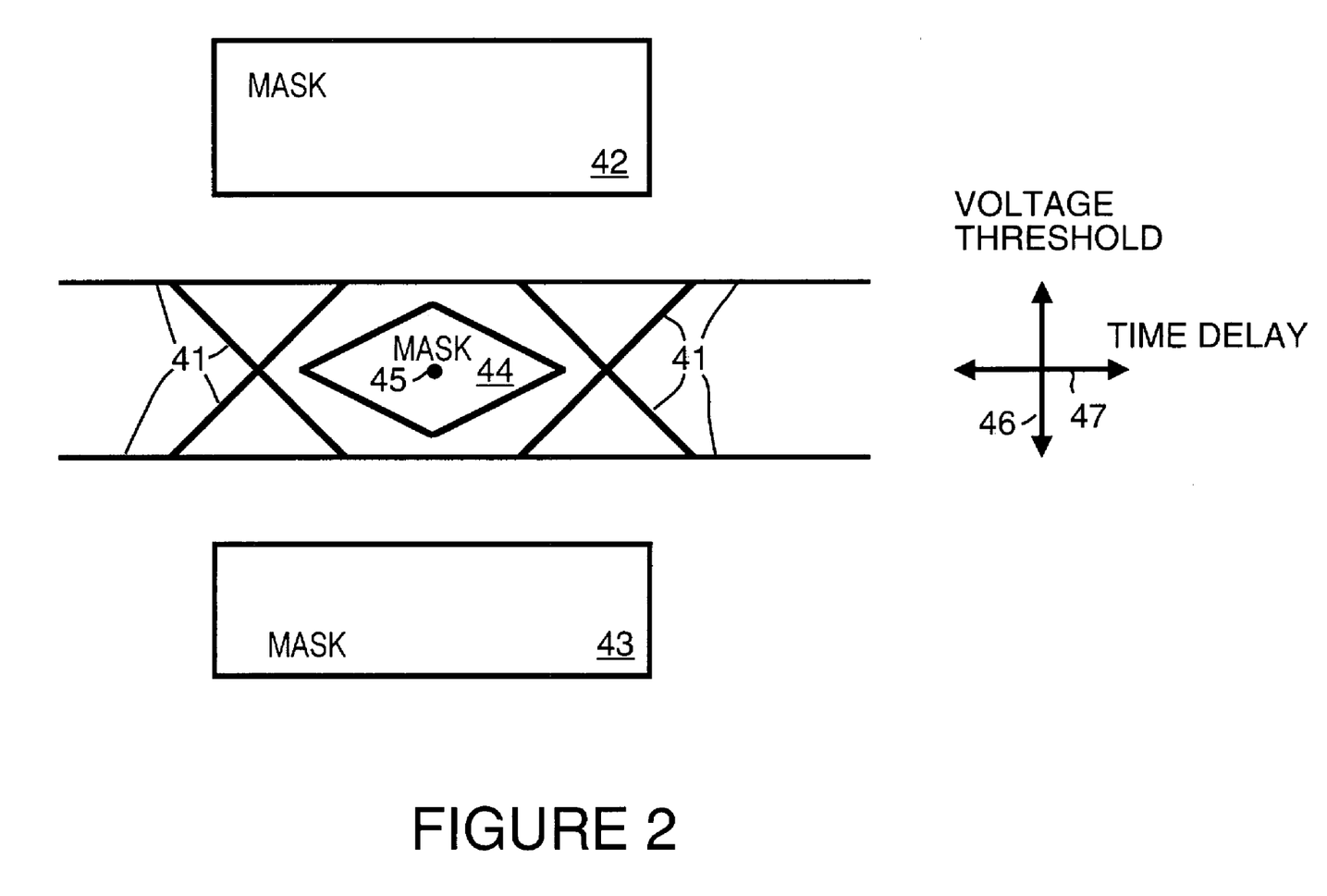
FIG. 2 is a simplified diagram showing a synchronization point from which sampling points of a top mask, a central mask and a low mask are determined in accordance with a preferred embodiment of the present invention.

FIG. 2 is a simplified eye diagram where signal traces 41 from overlapped cycles of a digital signal form an "eye" shape. A top mask 42, a low mask 43 and a center mask 44 are shown. In any digital signal cycle in which a value of the digital signal falls within any of the top mask 42, a low mask 43 and a center mask 44, a signal error has occurred.

A synchronization point 45 is used to locate sampling points along the boundaries of top mask 42, low mask 43 and center mask 44 during testing. Time delay (positive and negative) is varied in a direction represented by an arrow 47. Voltage threshold is varied in a direction represented by an arrow 46.

Figure 3:
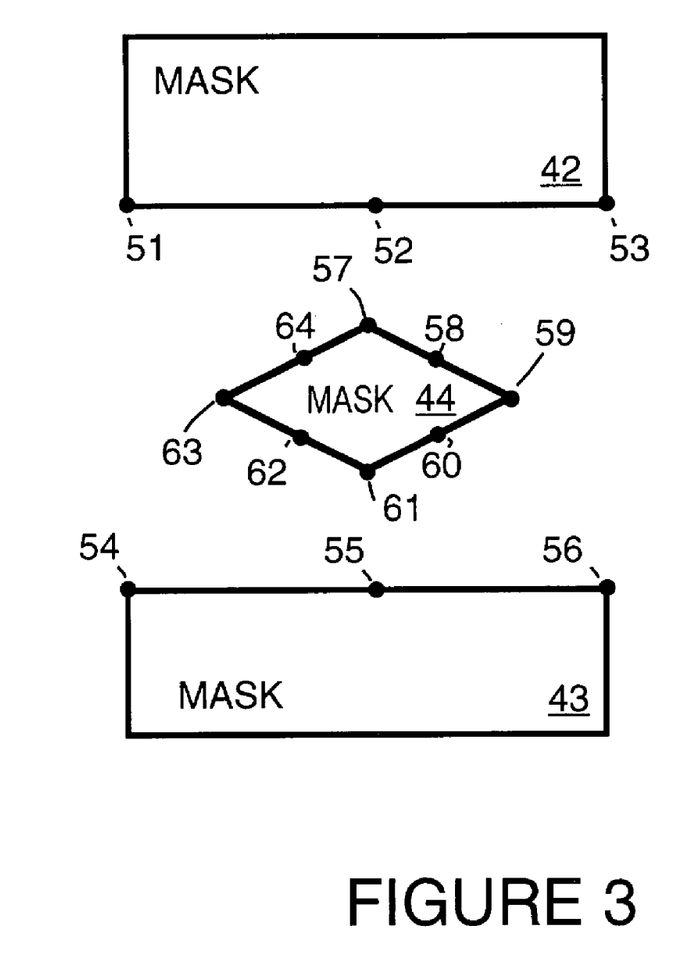
FIG. 3 is a simplified diagram illustrating sampling points of a top mask, a central mask and a low mask at which BER measurements are made in accordance with a preferred embodiment of the present invention.

FIG. 3 shows example sampling points of top mask 42, low mask 43 and center mask 44. A sampling point 51, a sampling point 52 and a sampling point 53 are shown on the lower edge of top mask 42. A sampling point 54, a sampling point 55 and a sampling point 56 are shown on the upper edge of low mask 43. A sampling point 57, a sampling point 58, a sampling point 59, a sampling point 60, a sampling point 61, a sampling point 62, a sampling point 63 and a sampling point 64 are shown on periphery of center mask 44.

The mask shapes shown in FIG. 2 and FIG. 3 are typical, but as will be clear to persons of ordinary skill in the art, the present invention applies to a wide variety of other mask shapes and number of mask regions with a wide variation in the number and location of sampling points on the mask shapes.

The error detecting system shown in FIG. 1 separately detects error rates for bits in the pattern that are 0's and for those that are 1's. By separately looking at the error rate in logic 0's and the error rate of logic 1's, mask compliance can be determined.

For determining the number of "mask hits" for equivalent DCA samples in low mask 43 the following approach is used. Testing is done at sample points 54, 55 and 56 to obtain an average BER. The BER that is measured is the BER for logic 0 test values, since the BER for logic 1 values should always be 0 because the sampling points are far below the voltage level of logic 1 values. If the waveform dips down into low mask 43 then it will be below the decision threshold for the sample points on mask 43 and will register as a logic 0. This is the intended value so no error is recorded. However, in most cases the waveform will be nearer the center of the eye (above the decision threshold of the sample points on mask 43) and will register as a logic 1 (an error). Thus unlike common BER measurements, to insure that there are no errors in low mask 43, BER for logic 0 values must be unity (1.00000). If the waveform dips into low mask 43 in the vicinity of the sampling point on 1/1000 bits, then BER for logic 0 values will be 0.9990.

The number of sampling points that must be averaged across low mask 43 must be sufficient that the waveform cannot dip down between sample points. To simplify the calculation, the spacing should be uniform and finely enough spaced that the low-pass filtered waveform does not have fine structure more rapid than the sampling point spacing. In FIG. 3, three sampling points are shown on mask 43 for illustration. For common application, 11 uniformly spaced sampling points is generally sufficient. If more sampling points than necessary are used, this complicates the measurement, without improving the accuracy. Use of 11 sampling points is much less than the number of sampling points that would be needed to map out the eye diagram. For example, mapping out an eye diagram my take, for example, a 200×200 array of sampling points for a total of 40,000 different sample points.

If a sample falls anywhere below the top edge of LOW MASK 43 it is a mask violation. There is no attempt to determine exactly where the sample falls to guarantee mask compliance. The average BER for logic 0 values that constitutes a mask failure can be calculated.

DCA samples are assumed to be uniformly spaced in time. The total number of samples (Ts) that could fall into LOW MASK 43 is set out by equation 1 below.

$$Ts = Nsamples * (1 - Markdensity) * Maskwidth(UI) \quad \text{Equation 1}$$

In equation 1, Nsamples is the number of DCA samples (typically 500,000). Markdensity is the ratio of 1 values to the total number of bits in the pattern. Markdensity is typically 0.5 for a balanced pseudo random bit sequence (PRBS) pattern. Markdensity can be determined exactly from a BERT total bit counter and a BERT total logic 1 value counter. Maskwidth(UI) is the width of the mask in unit intervals. For example, Maskwidth(UI) for low mask 43 is 1.0.

For fewer than Nviolations (typically equal to 1 to insure no violations) in the DCA measurements the pass criteria for average value (Average_LOW MASK_0's_BER) of the BER across all the sample points of low mask 43 is set out in Equation 2 below:

$$\text{Average\_LOW MASK\_0's\_}BER > 1 - [N\text{violations}/ (N\text{samples}*(1-\text{Markdensity})*\text{Maskwidth}(UI))] \quad \text{Equation 2}$$

For example, typical pass criteria for Average_LOW MASK_0's_BER is as set out below:

$$\text{Average\_LOW MASK\_0's\_}BER > 1 - 1/(500,000*0.5) = 0.999996$$

Calculation of Average_LOW MASK_0's_BER requires approximately Nsamples number of bit periods (clock cycles) for all sample points used to calculate Average_LOW MASK_0's_BER. For a clock cycle of 10 gigabits per second (Gb/s), this corresponds to 0.5 milliseconds (ms). In practice moving the sampling point and processing the data can take longer, but the measurement is very fast.

It is important to not require a lower number of errors simply because the measurement is faster. Mask margins are determined for a certain error rate threshold determined by the DCA sample rate. Increasing the required Average_LOW MASK_0's_BER threshold will result in rejecting good devices and should be avoided. Thus, this approach represents a way of radically speeding up the mask compliance measurement.

A similar approach can be applied to top mask 42. In this case the average BER for logic 1 values (Average_TOPMASK_1's_BER) is used. The mask test pass criterion for is set out in Equation 3 below:

$$\text{Average\_TOPMASK\_1's\_}BER > 1 - [N\text{violations}/ (N\text{samples}*(\text{Markdensity})*\text{Maskwidth}(U1))] \quad \text{Equation 3}$$

In central mask 44 sample points 59, 60, 61, 62 and 63 are used to calculate average_CENTRALMASK_0's_BER. The mask test pass criterion for is set out in Equation 4 below:

$$\text{Average\_CENTRALMASK\_0's\_}BER < [(N\text{violations}/(N\text{samples}*(1-\text{Markdensity})*\text{Maskwidth}(UI))] \quad \text{Equation 4}$$

In central mask 44 sample points 63, 64, 58 and 59 are used to calculate average_CENTRALMASK_1's_BER. The mask test pass criterion for is set out in Equation 5 below:

$$\text{Average\_CENTRALMASK\_1's\_}BER < [N\text{violations}/ (N\text{samples}*(\text{Markdensity})*\text{Maskwidth}(UI))] \quad \text{Equation 5}$$

There can be offsets in decision threshold of the digital decision circuit and this offset can vary as a function of the setting of the sampling threshold and the output error rate. The DCA is designed for accurate linearity and conforming frequency response and is the standard for these mask measurements. It is possible to roughly calibrate the decision circuit transfer standard based mask measurement using a device that has a representative waveform of the family of devices being tested. Since there are often no mask violations on a device being tested, it is necessary to vary the mask to compare the mask violation on the DCA and the BERT.

First, low mask 43 is offset vertically by Voff_DCA until a low error rate is detected in the DCA measurement. The low error rate, is for example, 5 mask violations/500,000 samples. Next the BERT mask is offset vertically by Voff_BERT until the same number of computed "mask violations" is obtained using the equations described above. Now low mask 43 is returned to it's original location but then offset by Voff_BERT–Voff_DCA. This process is repeated with lower half and then the upper half of central mask 44. In the process the vertical height of central mask 44 may be modified slightly. Finally, top mask 42 is offset analogous to low mask 43. Now with similar type of devices there should be much better agreement between the BERT-based mask measurement and the DCA measurement. This calibration mainly corrects for offset and linearity errors in the BERT decision circuit, but these effects can be significant.

Figure 4:
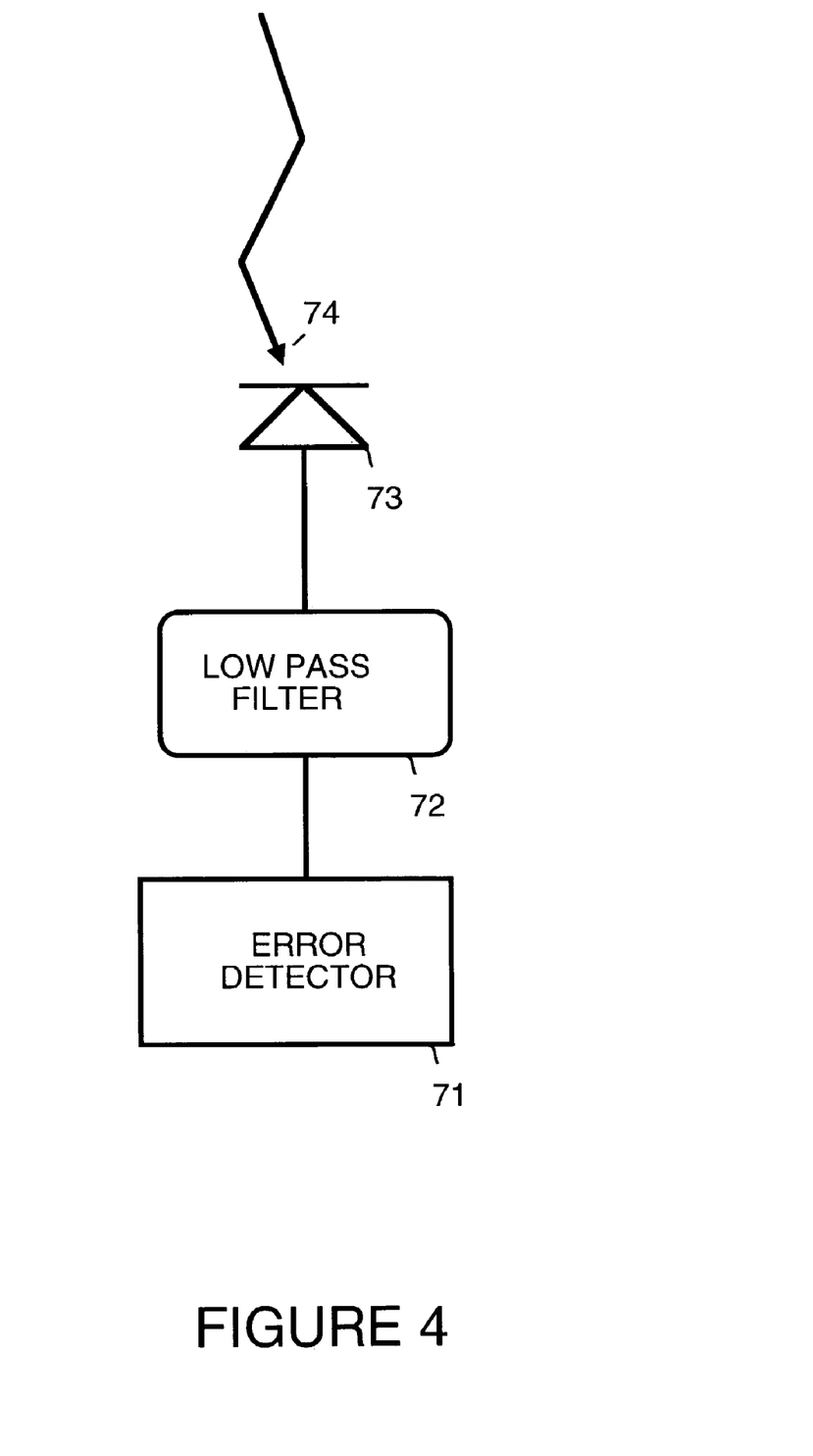
FIG. 4 is a simplified block diagram of an optical front end of an error detection circuit.

FIG. 4 is a simplified block diagram of an embodiment of front end 36 of error detector 23 for an optical output of DUT 22. The optical front end includes a photo diode 73 that detects impinging light as represented by an arrow 74. A low pass filter 72 is used to filter noise before the resulting signal is passed to error detector 23.

The frequency response of low pass filter 72 and error detector 23 is important as trade-offs between the time response (including rise time and over shoot) and noise are required. Typically, the overall filtering effect that photodetector 73, low pass filer 72 and error detector 23 has on signal response is specified carefully in standards documents and must be accurately measured before using it for waveform characterization.

Electrical sampling oscilloscopes can be used together with a photodiode front-end and matched filter to give the required frequency response. However due to the low sample rate of a sampling oscilloscope (e.g., ~40 ksamples/sec) compared to a typical incoming data steam (~10 Gb/s) it is not possible to measure a sufficient number of samples in a short test time to guarantee operation in all cases. It is desirable to measure every bit of the incoming data to speed the measurement. This can be achieved with a Bit Error Ratio Tester (BERT) provided with a calibrated optical front-end and matched filter.

The accuracy of this mask compliance measurement is limited by imperfections in the optical or electrical front-end of the digital decision circuit. If the frequency response of the photodetector, low pass filter and BERT decision circuit do not have a shape that matches that specified in the standard, the risetime of the "waveform" being measured will not be correct and mask violations may result. Care should be taken to insure that this response is as near to ideal as possible. Two methods to measure this response can be used, as further described below.

Figure 5:
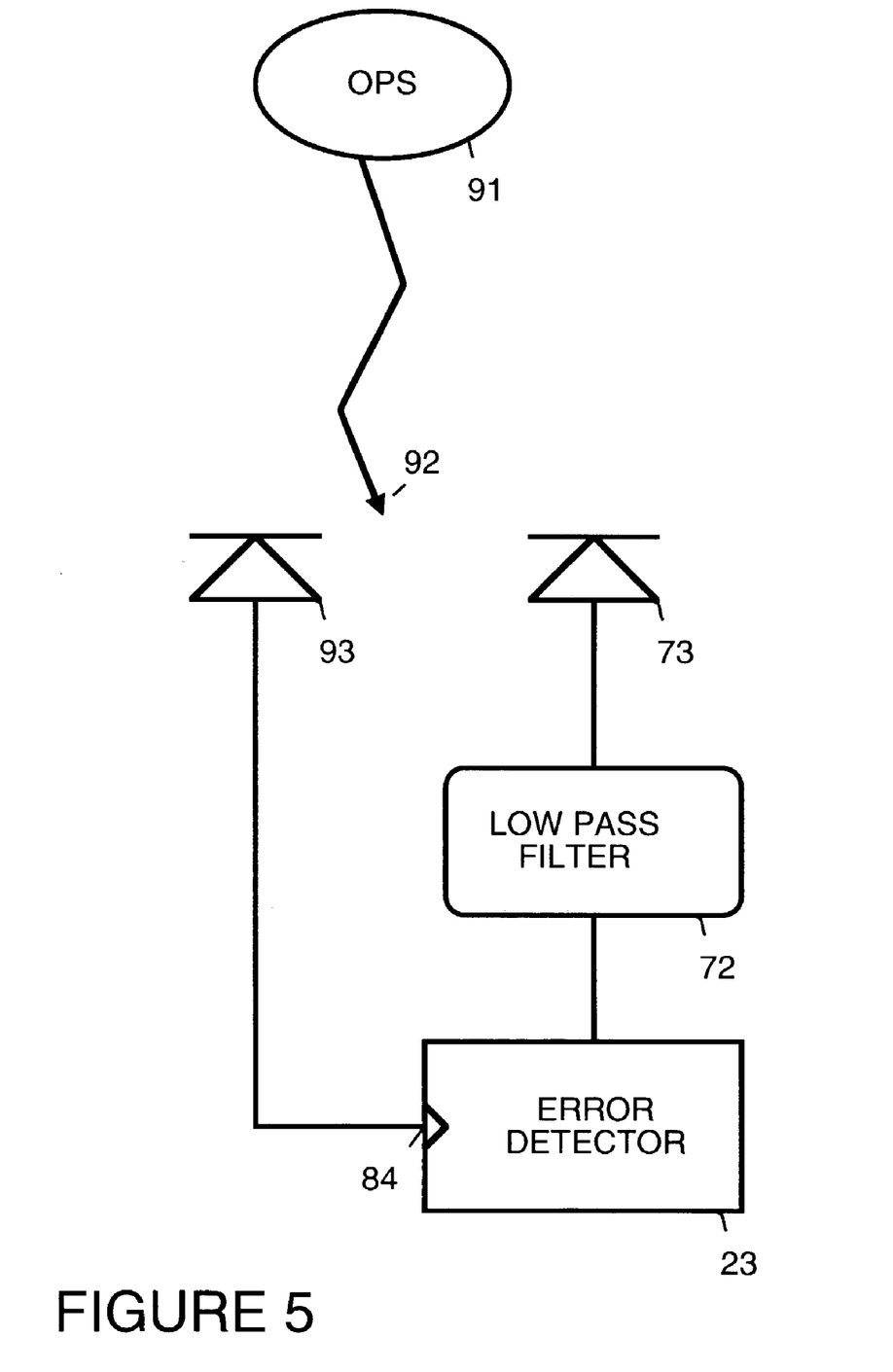
FIG. 5 is a simplified block diagram illustrating calibration of an optical front end of an error detection circuit in accordance with a preferred embodiment of the present invention.

FIG. 5 illustrates a first method to calibrate the optical front end of error detector 23. An optical pulse source 91 generates optical pulses. Optical pulse source 91 is implemented, for example, using a fiber ring laser, a mode locked solid state laser or a gain switched semiconductor laser. To make useful impulse response measurements it is important that the repetition rate of the impulse source be sufficiently low.

After taking a Fast Fourier Transform (FFT), the spacing of the points in the frequency domain transform will equal the repetition rate of optical pulse source 91. Thus repetitions rates of 50 MHz or lower are desirable for a 10 Gb/s system. A clock signal synchronous with the pulses generated by optical pulse source 91 is delivered to decision detector 71.

For example, if error detector 23 can operate at the fundamental repetition rate of the optical pulse source (OPS), then a clock can be derived by measuring the output of optical pulse source 91 with a separate photodetector. Specifically, a photo diode 93 supplies a synchronous clock signal to clock input 84 of error detector 23. In this way error detector 23 receives a clock signal that is synchronous with the pulses generated by optical pulse source 91. As will be understood by persons of ordinary skill in the art, alternative ways of generating a clock signal that is synchronous with the pulses generated by optical pulse source 91 can be used.

For example, optical pulses generated by optical pulse source 91 are viewed as a repeating all 1's pattern. Local pattern generator 31 is set to an all 1's pattern and the threshold value on line 33 of error detector 23 is adjusted to obtain 0.5 error rate as a function of clock delay. The result gives a single value waveform from 0 to 1/50 MHz (=20 ns). An FFT of the single value waveform gives the frequency response of the optical front-end derived from the periodic time response.

In some cases error detector 23 may not operate down to 50 MHz. If a high-speed clock at some known harmonic of optical pulse source 91 frequency is used, the measurement is still possible. To obtain the correct frequency relationship, either the clock source frequency is tunable (for example a voltage controlled oscillator (VCO)) or optical pulse source 91 has a tunable repetition frequency. The frequency ratio is then locked to the known value by controlling the frequency of the tunable element. A common implementation is to divide down (prescale) the clock source to the 50 MHz rate. A phase detector then compares the frequencies and feeds back to the tunable VCO or optical pulse source 91.

Since the divide ratio is known it is possible to use a counter in error detector 23, essentially performing a Bit specific BER on each successive bit of a pattern. The pattern of high speed bits has a length which matches the divide ratio.

For example, if the incoming data stream is at 10 Gb/s and optical pulse source 91 generates pulses at 50 MHz then the divide ratio is 200. Local pattern generator 31 is programmed to a 200-bit pattern which will be synchronous with the incoming signal from optical pulse source 91. By tuning first to bit 0 of the pattern and varying the delay from 0 to 100 picoseconds (ps) (1 high speed bit period) and measuring the threshold that gives 0.5 BER, the first bit is captured. The process is then repeated for each of the successive 199 bits. The results are stitched together to give a sequential measurement covering the full 20 ns time span. When only short delays are programmed on the BERT (100 ps) the accuracy of this measurement is likely to be better. After assembling the full time trace the signal is converted to frequency domain with an FFT, as before.

In cases where the incoming data is measured by error detector 23 producing a single-valued-waveform, it is possible to take the measured response and correct for optical front-end 36. This is done by first transforming the measured data and then dividing by the transformed front-end response. This is done, for example by using a standard digital filtering procedure or deconvolution. The FFT of an impulse response has the advantage that both the amplitude and the phase of the frequency response are derived and both are required for deconvolution. Deconvolution of the front-end response allows for obtaining more accurate single-valued measurements.

A similar approach can be used for calibrating decision circuits with electrical inputs. For example, optical pulse source 91 can be replaced with a electrical pulse source that supplies pulses directly to low pass filter 72 and the synchronous clock on clock input 84. Photodetectors 73 and 93 are eliminated.

Alternatively, if the electrical stimulus has fast but non-negligible transition times, the impulse response can be measured with some other calibration method, for example a sampling oscilloscope. The fast electrical stimulus then acts as a transfer standard to calibrate the front-end. This is performed by taking an FFT of the unknown front-end response with the fast electrical stimulus and then dividing by the FFT of the electrical stimulus measured on the reference system e.g. oscilloscope. The resulting frequency spectrum is the frequency response of the electrical front-end. This response can be transformed back to the time domain to get the impulse response of the electrical front-end, if desired. A similar transfer approach can be used for optical signals if an impulse source of sufficiently short duration is not available.

Figure 6:
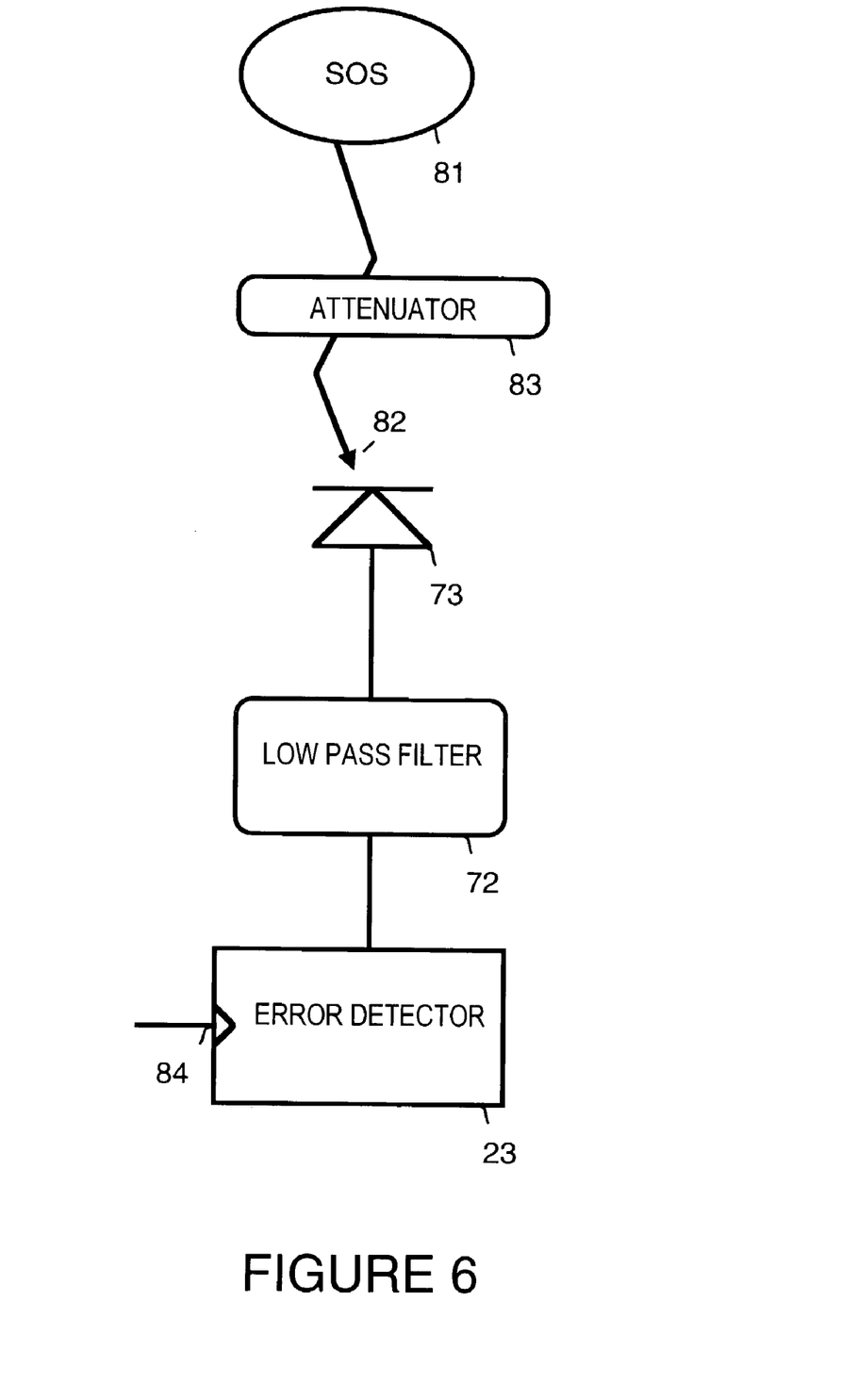
FIG. 6 is a simplified block diagram illustrating calibration of an optical front end of an error detection circuit in accordance with another preferred embodiment of the present invention.

FIG. 6 illustrates a second method to calibrate the optical front end of error detector 23. In this case, calibration of the optical front end of error detector 23 is performed using a sinusoidal optical source (SOS) 81. Digital decision circuits typically have bandwidths much lower than a sampling oscilloscope. To get an accurate measurement of the optical front-end frequency response error detector 23 must be included in the measurement. For example SOS 81 uses an optical heterodyne or an external optical modulator to produce a sinusoidal signal. Alternatively, SOS 81 uses an alternative method to produce a sinusoidal signal. SOS 81 produces a signal SOS(f) where f is the modulation frequency. The amplitude of the optical modulation can be adjusted with an optical attenuator 83. An asynchronous clock placed on line 84 is used to clock error detector 23. Local pattern generator 31 (shown in FIG. 1) is programmed to an all 0's and then an all 1's pattern. The threshold value on line 33 of error detector 23 (shown in FIG. 1) is varied to obtain a fixed error rate (typically $10^{-5}$) that is evaluated as a function of frequency for the all 1's case (Vthresh_hi(f)), and the all 0's case (Vthresh_lo(f)). The frequency response of the front-end can then be evaluated using Equation 6 below:

$$\text{Response}(f) = V\text{thresh\_hi}(f) - V\text{thresh\_lo}(f). \qquad \text{Equation 6}$$

Figure 7:
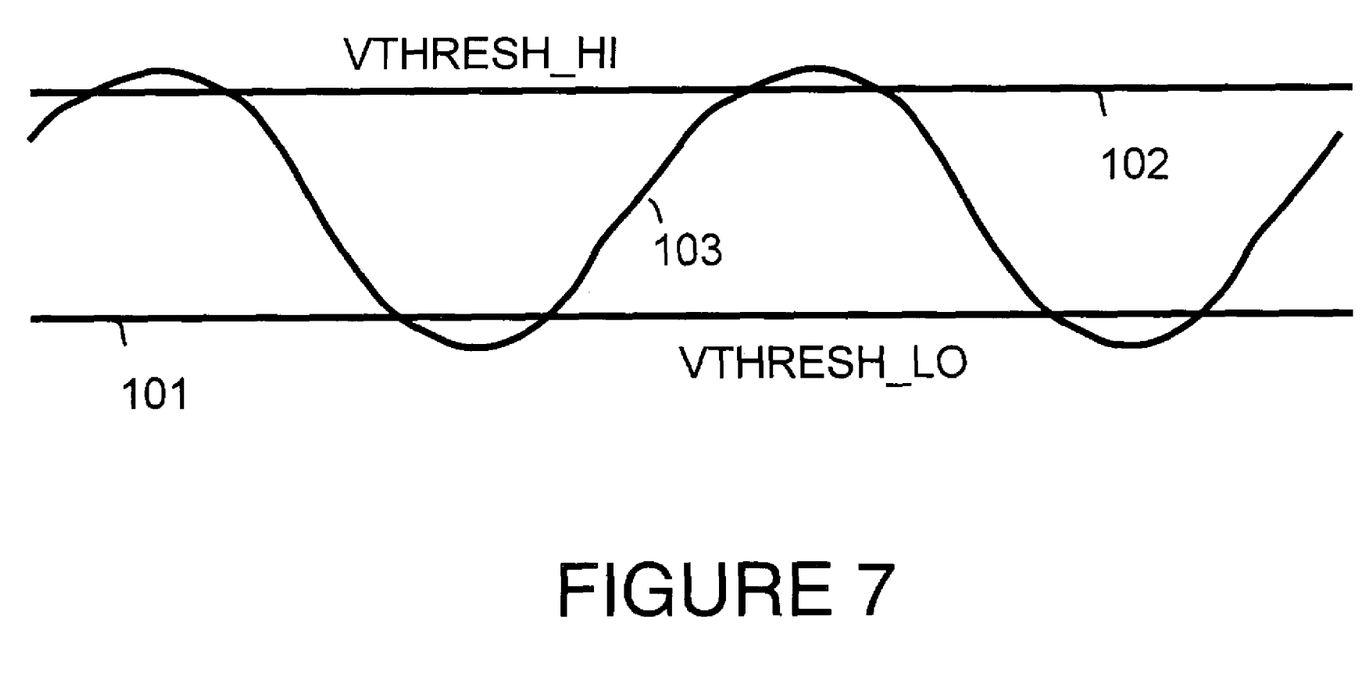
FIG. 7 is used to evaluation frequency response of a front end of an error detector in accordance with a preferred embodiment of the present invention.

Diagrammatically this can be seen in FIG. 7 where the frequency response of waveform 103 representing the input signal 103 is seen to cross high threshold level Vthresh_hi 102 and low threshold level Vthresh_lo 101. If the magnitude of the input optical sine wave is known to vary as a function of frequency, this is then normalized in the measured response.

This method has the advantage that it is only the relative areas of the sinusoid above and below the threshold lines that are important. This makes the input clock frequency to the decision circuit unimportant, except that it should not be at a harmonic of the signal generated by SOS 81 (in practice this is almost always the case) and it should be at a reasonably high frequency to insure proper averaging during the measurement interval. A typical frequency is, for example, 1.17 GHz (not a multiple of 1 GHz but in the GHz range). This simplifies the measurement. However, because the clock phase is not used, this method only derives the magnitude of the frequency response. In typical communications systems, it is the magnitude of the response that is specified, however.

Alternatively, the threshold, for example at Vthresh_hi can be set for an all 1's pattern at a low modulation frequency f and a fixed error rate. As the modulation frequency is increased, the attenuation in the optical path is decreased to maintain the same error rate. By measuring the attenuation as a function of modulation frequency the response of the front-end can be determined with 1 dB optical receiver response change corresponding to a 1 dB change in the attenuation setting. This alternate method has the advantage of dynamic range, provided SOS 81 has high optical power and attenuator 83 has wide dynamic range. Offsets in error detector 23 can cause errors in this approach. These errors are canceled out when the frequency response of the front end is calculated with the method where the front end is evaluated using Equation 6.

A sinusoidal wave source can also be used for a front-end that does not have a photodetector and takes electrical inputs. In this case, rather than SOS 81, a sinusoidal swept-frequency electrical (microwave) signal source is used. Optical attenuator 83 is replaced with a microwave attenuator. These microwave components are commonly available. The microwave signal source and attenuator can be calibrated with a microwave power meter, if desired.

Figure 8:
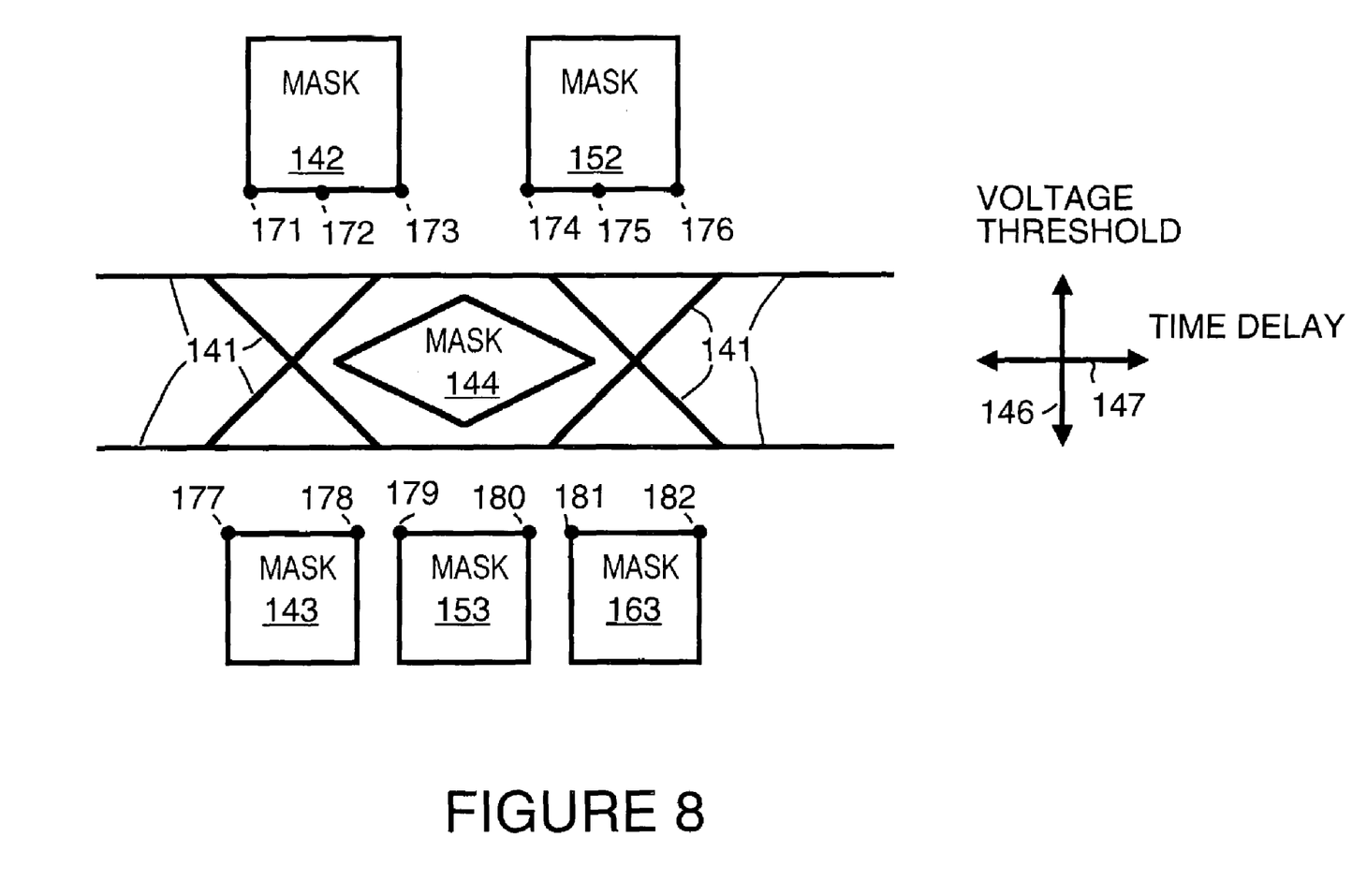
FIG. 8 is a simplified illustrating sampling points of multiple top masks at which BER measurements are made in accordance with another preferred embodiment of the present invention.

FIG. 8 is a simplified illustrating sampling points of multiple top masks at which BER measurements are made. In FIG. 8, signal traces 141 from overlapped cycles of a digital signal form an "eye" shape. A top mask region 142, a top mask region 152, a low mask 143, a low mask 153, a low mask 163 and a center mask 144 are shown. Time delay (positive and negative) is varied in a direction represented by an arrow 147. Voltage threshold is varied in a direction represented by an arrow 146. A sampling point 171, a sampling point 172 and a sampling point 173 are shown on the lower edge of top mask region 142. A sampling point 174, a sampling point 175 and a sampling point 176 are shown on the lower edge of top mask region 152. A sampling point 177 and a sampling point 178 are shown on the upper edge of low mask region 143. A sampling point 179 and a sampling point 180 are shown on the upper edge of low mask region 153. A sampling point 181 and a sampling point 182 are shown on the upper edge of low mask region 163.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for determining mask compliance of a digital signal from a reference device comprising the following steps:
    (a) detecting bit error rates for first sampling points for a low mask region;
    (b) averaging the bit error rates for the first sampling points to produce an average low mask region error rate;
    (c) detecting bit error rates for second sampling points for a high mask region; and,
    (d) averaging the bit error rates for the second sampling points to produce an average high mask region error rate.

2. A method as in claim 1 additionally comprising the following steps:
    (c) detecting bit error rates for third sampling points for a middle mask region; and,
    (d) averaging the bit error rates for the third sampling points to produce an average middle mask region error rate.

3. A method as in claim 1 wherein step (a) comprises the following substeps for each of the first sampling points:
    (a.1) setting a voltage threshold for an error detector circuit equal to a voltage level of a sampling point; and,
    (a.2) recording an error when a detected voltage of the digital signal is below the threshold level.

4. A method as in claim 1 wherein step (c) comprises the following substeps for each of the second sampling points:
    (c.1) setting a voltage threshold for an error detector circuit equal to a voltage level of a sampling point; and,
    (c.2) recording an error when a detected voltage of the digital signal is above the threshold level.

5. A method as in claim 1 wherein step (a) includes choosing a number of first sampling points to produce a total number of measurements equal to a standard number of measurements used for determining mask compliance with a digital communications analyzer.

6. A method as in claim 1 wherein step (a) includes choosing a number of first sampling points to produce a total number of measurements equal to a standard number of measurements used for determining mask compliance with a digital communications analyzer and wherein step (c) includes choosing a number of second sampling points to produce a total number of measurements equal to a standard number of measurements used for determining mask compliance with a digital communications analyzer.

7. A method as in claim 1 wherein in step (a) bit error rates are detected only for cases where the digital signal is at a logic 0 value.

8. A method as in claim 1 wherein in step (c) bit error rates are detected only for cases where the digital signal is at a logic 1 value.

9. A method as in claim 1 wherein the reference device is a device under test.

10. A method as in claim 1 additionally comprising the following step performed before step (a):
    calibrating a front end of an error detector used to detect bit error rates, the calibrating including correction for offset and linearity errors.

11. A method as in claim 1 additionally comprising the following step performed before step (a):
    calibrating a front end of an error detector used to detect bit error rates, including the following substeps:
    generating pulses using a pulse source,
    clocking the error detector synchronously with the generated pulses,
    varying offset time and voltage threshold of the error detector to detect phase and frequency errors caused by the front end of the error detector, and
    calibrating the error detector to account for the detected phase and frequency errors.

12. A method as in claim 1 additionally comprising the following step performed before step (a):
    calibrating a front end of an error detector used to detect bit error rates, including the following substeps:
    generating a sinusoidal signal using a signal source,
    clocking the error detector asynchronously to the sinusoidal signal,
    varying sinusoidal signal frequency and voltage threshold of the error detector to detect response of the error detector in combination with the front end at a plurality of signal frequencies, and
    calibrating the error detector to account for the detected response of the error detector in combination with the front end.

13. A method as in claim 1 additionally comprising the following steps:
    (e) detecting bit error rates for third sampling points for a second high mask region; and,
    (f) averaging the bit error rates for the third sampling points to produce an average second high mask region error rate.

14. A method as in claim 1 additionally comprising the following steps:
    (e) detecting bit error rates for third sampling points for a second low mask region; and,
    (f) averaging the bit error rates for the third sampling points to produce an average second low high mask region error rate.

15. A method as in claim 1 additionally comprising the following steps:
- (e) detecting bit error rates for third sampling points for a second low mask region;
- (f) averaging the bit error rates for the third sampling points to produce an average second low high mask region error rate;
- (g) detecting bit error rates for fourth sampling points for a third low mask region; and,
- (h) averaging the bit error rates for the fourth sampling points to produce an average third low high mask region error rate.

16. A method for determining mask compliance of a digital signal from a reference device comprising the following steps:
- (a) detecting bit error rates for first sampling points for a low mask region;
- (b) averaging the bit error rates for the first sampling points to produce an average low mask region error rate;
- (c) detecting bit error rates for second sampling points for a middle mask region; and,
- (d) averaging the bit error rates for the second sampling points to produce an average middle mask region error rate.

17. A method for determining mask compliance of a digital signal from a reference device comprising the following steps:
- (a) detecting bit error rates for first sampling points for a high mask region;
- (b) averaging the bit error rates for the first sampling points to produce an average high mask region error rate;
- (c) detecting bit error rates for second sampling points for a middle mask region; and,
- (d) averaging the bit error rates for the second sampling points to produce an average middle mask region error rate.

\* \* \* \* \*

UNITED STATES PATENT AND TRADEMARK OFFICE
CERTIFICATE OF CORRECTION

| | | |
|---|---|---|
| PATENT NO. | : 7,154,944 B2 | Page 1 of 1 |
| APPLICATION NO. | : 10/284805 | |
| DATED | : December 26, 2006 | |
| INVENTOR(S) | : Jungerman | |

It is certified that error appears in the above-identified patent and that said Letters Patent is hereby corrected as shown below:

On Title Page, Item (56), under "U.S. Patent Documents", line 1, after "6,785,622" delete "B1" and insert -- B2 --, therefor.

On Title Page, Item (56), under "U.S. Patent Documents", line 1, after "6,810,346" delete "B1" and insert -- B2 --, therefor.

Signed and Sealed this

Seventeenth Day of April, 2007

JON W. DUDAS
*Director of the United States Patent and Trademark Office*